(12) United States Patent
Kim et al.

(10) Patent No.: US 10,903,157 B2
(45) Date of Patent: Jan. 26, 2021

(54) SEMICONDUCTOR DEVICE HAVING A GLASS SUBSTRATE CORE LAYER

(71) Applicant: SKC Co., Ltd., Suwon-si (KR)

(72) Inventors: Sung Jin Kim, Suwanee, GA (US); Young-Ho Rho, Daejeon (KR); Jin Cheol Kim, Hwaseong-si (KR); Byung Kyu Jang, Suwon-si (KR)

(73) Assignee: SKC Co., Ltd., Suwon-si (KR)

( * ) Notice: Subject to any disclaimer, the term of this patent is extended or adjusted under 35 U.S.C. 154(b) by 0 days.

(21) Appl. No.: 16/296,659

(22) Filed: Mar. 8, 2019

(65) Prior Publication Data

US 2020/0286819 A1    Sep. 10, 2020

(51) Int. Cl.
*H01L 23/49* (2006.01)
*H01L 23/15* (2006.01)
*H01L 23/498* (2006.01)
*H01L 25/065* (2006.01)
*H01L 21/48* (2006.01)

(52) U.S. Cl.
CPC ...... *H01L 23/49838* (2013.01); *H01L 21/486* (2013.01); *H01L 23/15* (2013.01); *H01L 23/49827* (2013.01); *H01L 25/0652* (2013.01); *H01L 2224/2105* (2013.01); *H01L 2224/24155* (2013.01); *H01L 2224/24225* (2013.01); *H01L 2224/24226* (2013.01); *H01L 2224/29188* (2013.01); *H01L 2225/06513* (2013.01); *H01L 2225/06517* (2013.01)

(58) Field of Classification Search
CPC ............... H01L 23/49838; H01L 23/15; H01L 23/49827; H01L 25/0652; H01L 2224/29188; H01L 2224/24155; H01L 2224/24225; H01L 2224/24226; H01L 2224/2105
See application file for complete search history.

(56) References Cited

U.S. PATENT DOCUMENTS

| | | | | |
|---|---|---|---|---|
| 6,791,178 | B2* | 9/2004 | Yamaguchi | H01L 21/486 257/699 |
| 6,831,357 | B2* | 12/2004 | Nishitani | H01L 21/4857 257/697 |
| 7,588,835 | B2* | 9/2009 | Yamashita | C23C 8/02 148/277 |
| 8,065,794 | B2* | 11/2011 | En | C23C 18/1607 29/847 |
| 9,159,602 | B2* | 10/2015 | Andry | H01L 21/6835 |
| 9,287,172 | B2* | 3/2016 | Yu | H01L 23/15 |
| 10,163,771 | B2* | 12/2018 | Zuo | H01L 28/40 |
| 10,269,723 | B2* | 4/2019 | Huang | H01L 21/76877 |

(Continued)

*Primary Examiner* — Ida M Soward
(74) *Attorney, Agent, or Firm* — NSIP Law

(57) ABSTRACT

Disclosed are a packaging substrate and a semiconductor device. The semiconductor device includes an element unit including a semiconductor element and a packaging substrate electrically connected to the element unit. By applying a glass substrate to the packaging substrate as a core substrate, connecting the semiconductor element and a motherboard can be closer to each other, so that electrical signals are transferred through as short a path, and significantly improved electrical properties such as a signal transfer rate could be achieved. Also, it is possible to prevent an occurrence of a parasitic element effect and to apply to a high-speed circuit device without additional insulating process.

16 Claims, 8 Drawing Sheets

(56) References Cited

U.S. PATENT DOCUMENTS

| | | | |
|---|---|---|---|
| 10,477,702 B2* | 11/2019 | Chujo | H05K 3/423 |
| 10,510,645 B2* | 12/2019 | Wang | H01L 25/105 |
| 10,535,622 B2* | 1/2020 | Hu | H01L 21/6835 |
| 2008/0073780 A1* | 3/2008 | Imori | H01L 21/563 |
| | | | 257/729 |
| 2011/0304999 A1* | 12/2011 | Yu | H01L 23/15 |
| | | | 361/783 |
| 2012/0106117 A1* | 5/2012 | Sundaram | H01L 23/49827 |
| | | | 361/808 |
| 2013/0181325 A1* | 7/2013 | Chen | H01L 21/76898 |
| | | | 257/532 |
| 2013/0242493 A1* | 9/2013 | Shenoy | H01L 23/49827 |
| | | | 361/679.21 |
| 2016/0043056 A1* | 2/2016 | Chiu | H01L 23/15 |
| | | | 257/741 |
| 2016/0049389 A1* | 2/2016 | Chen | H01L 21/56 |
| | | | 438/108 |
| 2016/0111380 A1* | 4/2016 | Sundaram | H01L 23/562 |
| | | | 257/774 |
| 2017/0018492 A1* | 1/2017 | Imayoshi | H01L 23/49827 |
| 2017/0040247 A1* | 2/2017 | Shen | H01L 23/49827 |
| 2017/0110393 A1* | 4/2017 | Tain | H01L 23/49894 |
| 2017/0243834 A1* | 8/2017 | Lai | H01L 23/49811 |
| 2018/0358685 A1* | 12/2018 | Han | H01Q 1/2283 |
| 2019/0057917 A1* | 2/2019 | Tsai | H01L 24/97 |
| 2019/0115258 A1* | 4/2019 | Tsai | H01L 23/481 |

* cited by examiner

SEMICONDUCTOR DEVICE HAVING A GLASS SUBSTRATE CORE LAYER

BACKGROUND

1. Field

The present application relates to a semiconductor device having a glass substrate core layer.

2. Discussion of Related Art

In the manufacturing of electronic components, the implementation of a circuit on a semiconductor wafer is referred to as a Front-End Process (FE), and the assembly of a wafer such that it can be actually used in a product is referred to as a Back-End Process (BE). Back-End processes includes a packaging process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but is not supported by packaging technology completely. Thus, it is considered that the electrical performance of packaged semiconductors may be determined by the packaging technology with electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to a high resistance or high dielectric constant. In the case of a resin substrate, it is possible to mount a high-performance and high-frequency semiconductor element thereon, but there is a distinct limitation to the reduction of pitches of conductive lines. Recently, researches are being conducted to apply silicon or glass to a high-end packaging substrate. By forming a through-via on a silicon or glass substrate and applying a conductive material into the through-via, it is possible to shorten a length of conductive lines between an element and a motherboard, and have excellent electric characteristics.

RELATED ART DOCUMENTS

Patent Documents

Korean Patent Publication No. 10-2019-0008103
Korean Patent Publication No. 10-2016-0114710
Korean Patent No. 10-1468680

SUMMARY

The present application has been devised to solve the aforementioned problems, and the present application discloses a packaging substrate integrated by applying a glass substrate and a semiconductor device including the same.

According to an aspect of the present application, it is provided a semiconductor device including an element unit including a semiconductor element; and a packaging substrate electrically connected to the element unit. The packaging substrate includes a core layer and an upper layer. The core layer includes i) a glass substrate having first surface and second surface facing each other, ii) a plurality of core vias passing through the glass substrate in a thickness direction thereof, and iii) a core distribution layer having an electrically conductive layer, which is placed on a surface of the glass substrate or a surface of core vias and configured to at least partially electrically connect electrically conductive layers of the first and second surfaces through the core vias.

The upper layer, placed on the first surface, includes an electrically conductive layer, which electrically connects the core distribution layer and an external semiconductor element unit.

An organic substrate may be substantially excluded from the packaging substrate.

The semiconductor device may further include a board unit placed under the packaging substrate.

Any substrate other than the glass substrate may not be applied between the element unit and the board unit.

According to another aspect of the present application, it is provided a packaging substrate including A. a core layer including i) a glass substrate having first surface and second surface facing each other, ii) a plurality of core vias passing through the glass substrate in a thickness direction thereof, and iii) a core distribution layer having an electrically conductive layer, which is placed on a surface of the glass substrate or a surface of core vias, and which is configured to at least partially electrically connect electrically conductive layers of the first and second surfaces through the core vias; and B. an upper layer, placed on the first surface, and including an electrically conductive layer, which electrically connects the core distribution layer and an external semiconductor element unit; wherein an organic substrate is substantially excluded from the packaging substrate.

The packaging substrate and the semiconductor device including the same according to the present application can significantly improve electrical properties such as a signal transfer rate by connecting the semiconductor element and a motherboard to be closer to each other so that electrical signals are transferred through as short a path as possible. Also, since the glass substrate as an insulator applies as a substrate core, there is lower possibility of occurring parasitic element effect on the device compared to a device with a conventional silicon core, and thus it is possible to apply to a high-speed circuit device without additional insulating process. In addition, unlike silicon being manufactured in the form of a round wafer shape, the glass substrate is manufactured in the form of a large panel, and thus mass production is relatively easy and economic efficiency can be further improved.

DETAILED DESCRIPTION OF EXEMPLARY EMBODIMENTS

Figure 1:
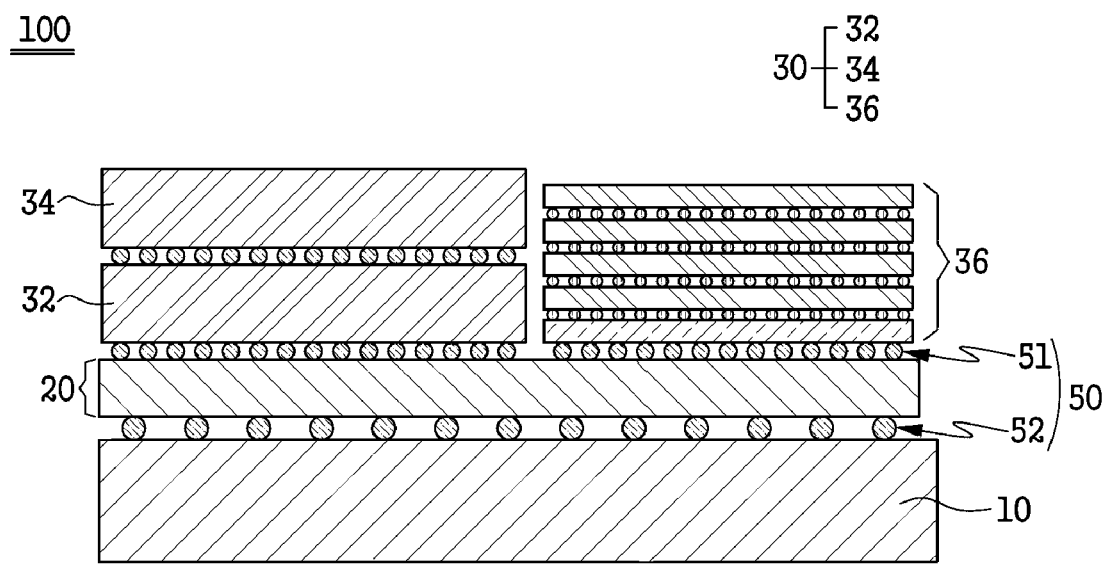
FIG. 1 is a conceptual view for illustrating a cross section of a semiconductor device according to an embodiment of the present application.

Hereinafter, example embodiments of the present application will be described in detail with reference to the accompanying drawings so that they can be easily practiced by those skilled in the art to which the present invention pertains. The example embodiments may, however, be embodied in many different forms and is not to be construed as being limited to the embodiments set forth herein. Like reference numerals designate like elements throughout the specification.

Throughout the present application, the phrase "combination(s) thereof" included in a Markush-type expression denotes one or more mixtures or combinations selected from the group consisting of components stated in the Markush-type expression, that is, denotes that one or more components selected from the group consisting of the components are included.

Throughout this application, terms such as "first," "second," "A," or "B" are used to distinguish the same terms from each other. The singular forms "a," "an," and "the" include the plural form unless the context clearly dictates otherwise. In this application, the term "X-based" may mean that a compound includes a compound corresponding to X or a derivative of X.

In this application, "B being placed on A" means that B is placed in direct contact with A or placed over A with another layer interposed therebetween and thus should not be interpreted as being limited to B being placed in direct contact with A.

In this application, "B being connected to A" means that B is connected to A directly or through another element therebetween, and thus should not be interpreted as being limited to B being directly connected to A, unless otherwise noted.

In this application, a singular form is contextually interpreted as including a plural form as well as a singular form unless specially stated otherwise.

The inventors of the present invention have recognized that, in the process of developing a semiconductor device capable of exhibiting high performance with a more integrated and thinner thickness, not only the device itself but also the packaging process is an important factor for improving its performance. The inventors have confirmed that, by applying a glass core in a single layer and controlling the shape of a through-via, an electrically conductive layer formed thereon, etc., it is possible to make a packaging substrate thinner and to improve the electrical property of the semiconductor device, unlike a conventional interposer and organic substrate in which two or more layers of cores are applied on a motherboard as a packaging substrate, and thus have completed this invention.

Figure 2:
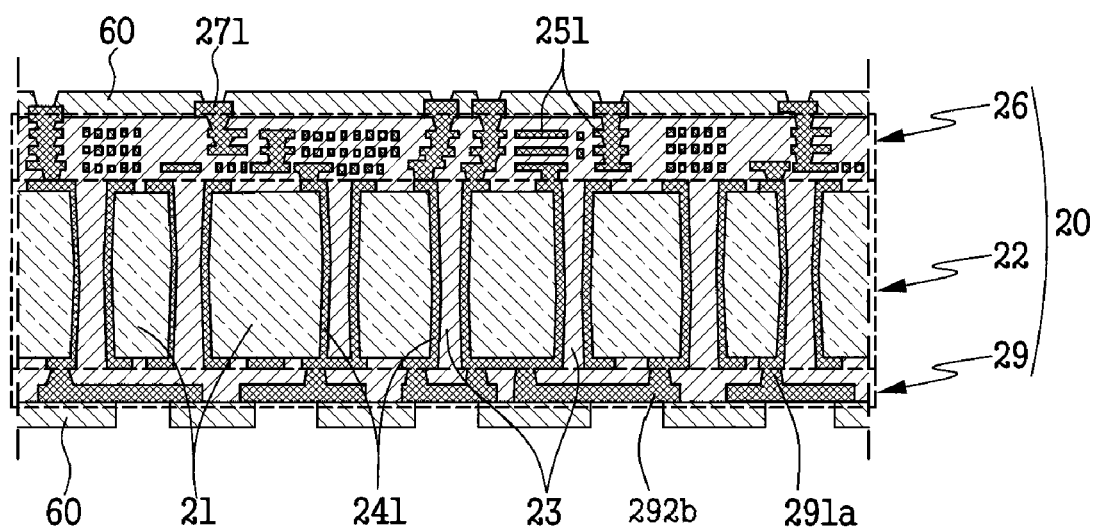
FIG. 2 is a conceptual view for illustrating a cross section of a packaging substrate according to another embodiment of the present application.
Figure 3:
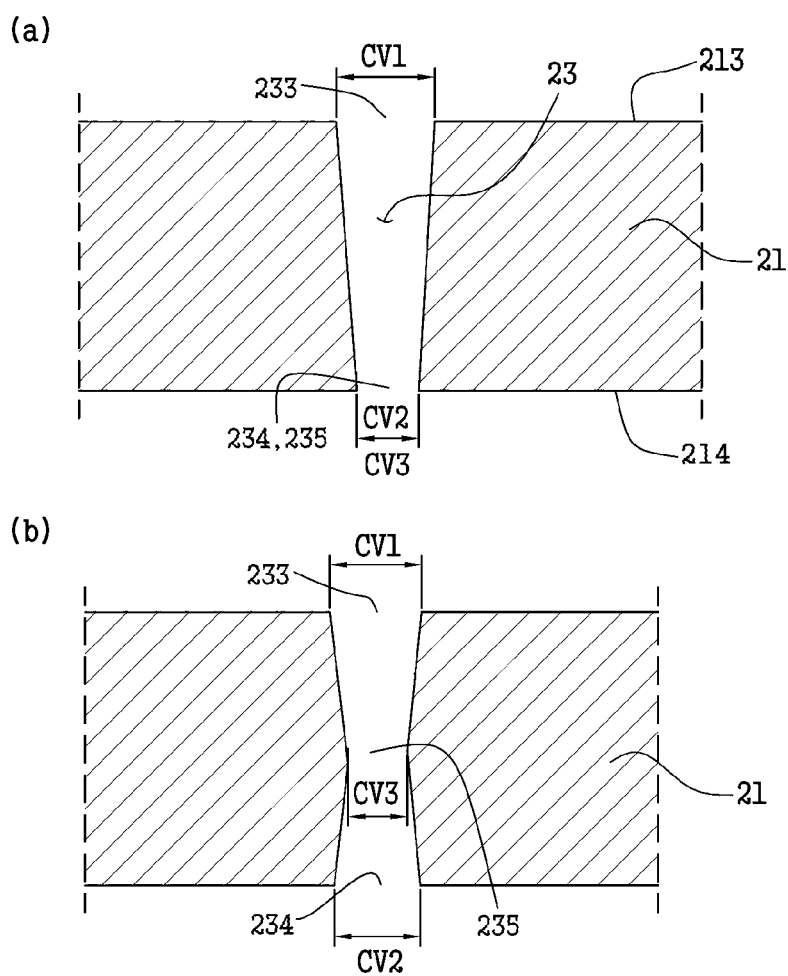
FIGS. 3 (a) and (b) are conceptual views for illustrating cross sections of a core via applied according to the present application.
Figure 4:
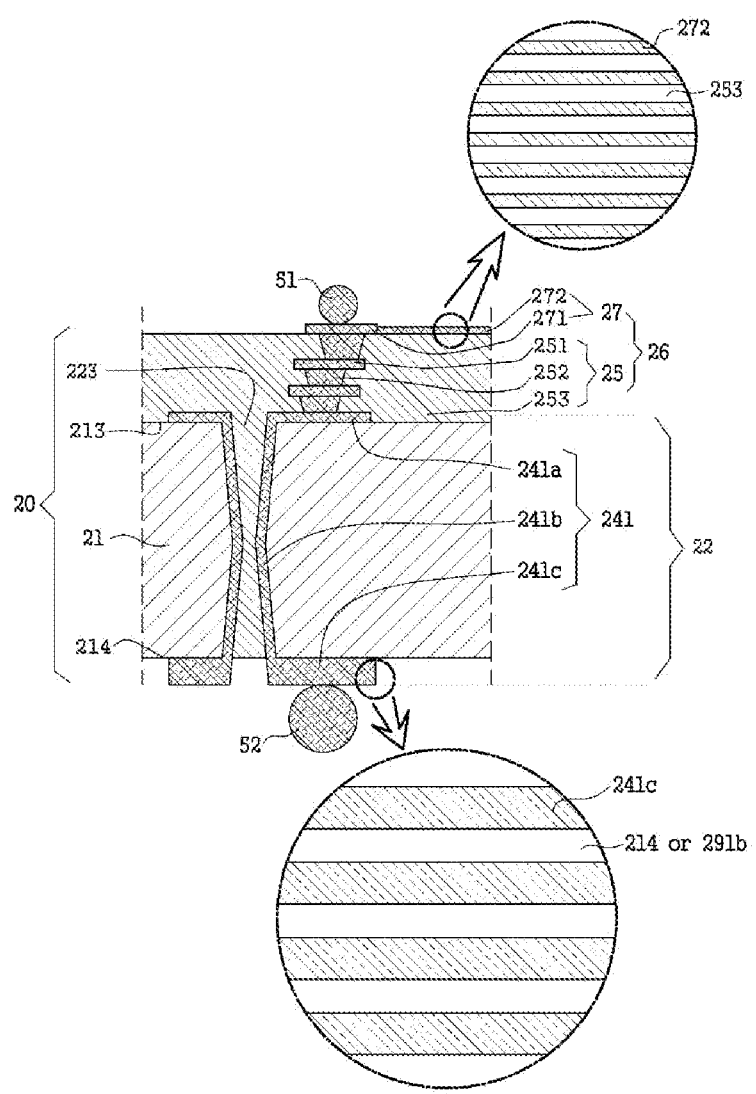
FIGS. 4 and 5 are detailed conceptual views for illustrating a part of cross sections of a packaging substrate according to an embodiment of the present invention (a circle indicates a view obtained through observation from the top or the bottom.)
Figure 5:
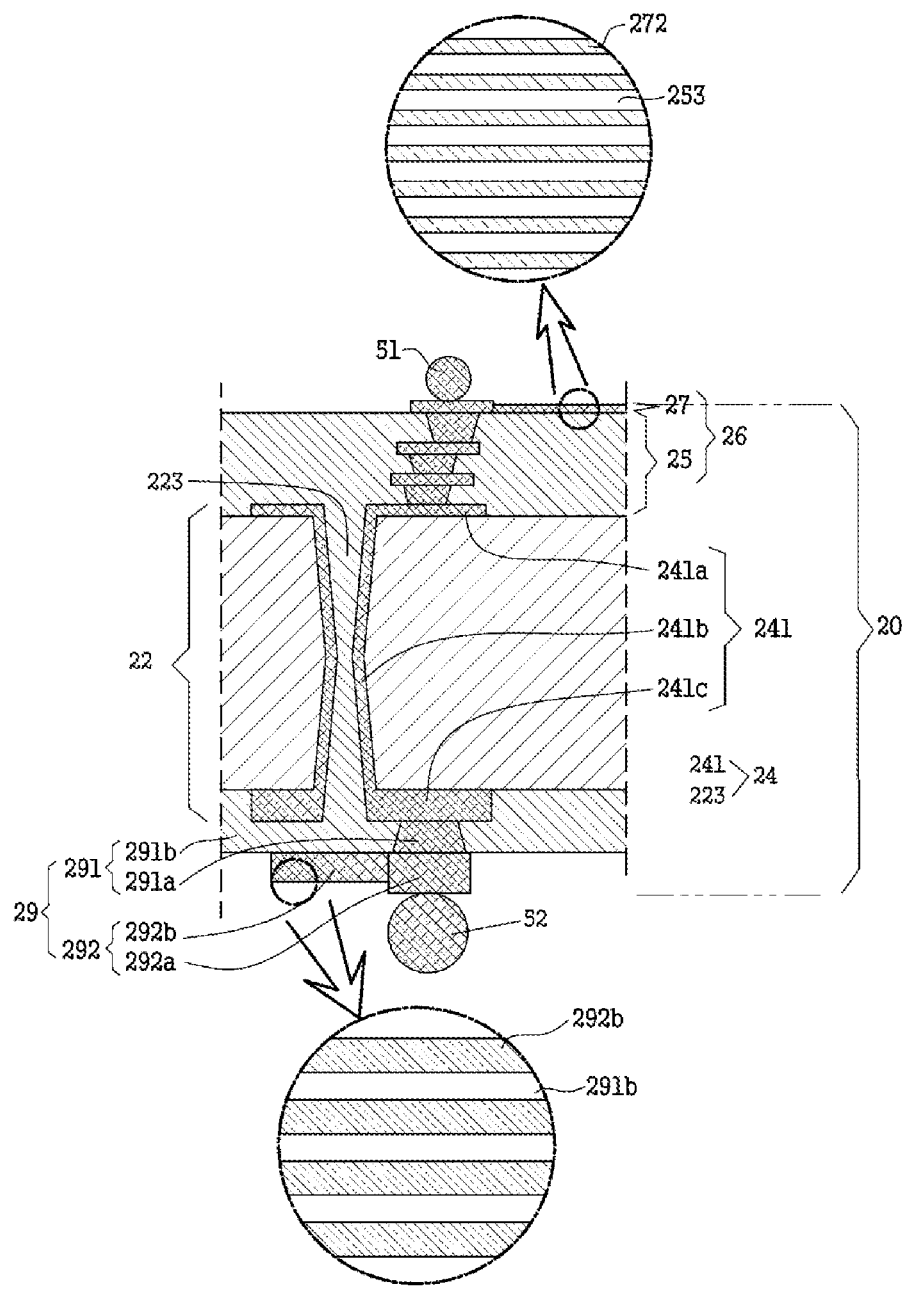

FIG. 1 is a conceptual view for illustrating a cross section of a semiconductor device according to an embodiment of the present invention, FIG. 2 is a conceptual view for illustrating a cross section of a packaging substrate according to another embodiment of the present invention, FIGS. 3 (a) and (b) are conceptual views for illustrating a cross section of a core via applied according to the present invention, and FIGS. 4 and 5 are detailed conceptual views for illustrating a part of cross sections of a packaging substrate according to an embodiment of the present invention (a circle indicates a view obtained through observation from the top or the bottom.). The present application will be described below in detail with reference to FIGS. 1 to 5.

To achieve the above objectives, a semiconductor device 100 according to an embodiment of the present application comprises a semiconductor element unit 30 having one or more semiconductor elements 32, 34, and 36 positioned thereon; a packaging substrate 20 electrically connected to the semiconductor elements 32, 34, and 36; and a motherboard 10 electrically connected to the packaging substrate 20 and configured to transfer external electrical signals to the semiconductor elements 32, 34, and 36 and connect the semiconductor elements 32, 34, and 36 to one another.

The packaging substrate 20 according to another embodiment of the present application comprises a core layer 22 and an upper layer 26.

The semiconductor element unit 30 comprises one or more elements mounted on a semiconductor device and is mounted on the packaging substrate 20 through a connecting electrode or the like. In detail, for example, a computation element such as a central processing unit (CPU) and a graphics processing unit (GPU) (a first element 32 and a second element 34), a memory element such as a memory chip (a third element 36), or the like may be applied as the semiconductor element unit 30, but any semiconductor element capable of being mounted on a semiconductor device may be applicable without limitation.

A motherboard such as a printed circuit board and a printed wiring board may be applied as the motherboard 10.

The packaging substrate 20 comprises a core layer 22 and an upper layer 26 deposed on one side of the core layer 22.

Optionally, the packaging substrate 20 may further comprise a lower layer 29 deposed under the core layer 22.

The core layer 22 comprises a glass substrate 21; a plurality of core vias 23 passing through the glass substrate 21 in a thickness direction thereof; and a core distribution layer 24 deposed on a surface of the glass substrate 21 or a surface of the core via 23 and having at least a part of an electrically conductive layer for electrically connecting an electrically conductive layer of a first surface and an electrically conductive layer of a second surface through the core vias 23.

The glass substrate 21 has a first surface 213 and a second surface 214 facing each other, and the two surfaces are substantially parallel to each other and have a substantially uniform thickness throughout the glass substrate.

The glass substrate 21 has a core via 23 passing through the first surface 213 and the second surface 214.

Conventionally, a silicon substrate and an organic substrate were applied while being stacked thereon, as the packaging substrate of the semiconductor device. When a silicon substrate is applied to a high-speed circuit, a parasitic element effect may occur due to the semiconductor property of the silicon substrate, and relatively large power loss may be a result. Also, an organic substrate requires a larger area to form a more complicated distribution pattern, but this does not correspond to the miniaturization trend of electronic devices. In order to form a complicated distribution pattern within a predetermined size, it is necessary to make patterns finer substantially, but there has been a practical limit to the miniaturization of the patterns due to a material property of the organic substrate.

According to the present application, the glass substrate 21 is applied as a supporting body for the core layer 22 in order to solve these problems. Also, by applying the core via 23 formed to pass through the glass substrate 21, as well as the glass substrate 21, it is possible to provide a packaging substrate 20 having a shortened electrical flow length, a smaller size, a faster response, and a lower loss property.

As the glass substrate 21, a glass substrate applied to semiconductor field can be applied. For example, a borosilicate glass substrate, a non-alkali glass substrate, or the like may be applicable, but the present application is not limited thereto.

The glass substrate 21 may have a thickness of 1,000 um or less, 100 um to 1,000 um, or 100 um to 700 um. More specifically, the glass substrate 21 may have a thickness of 100 um to 500 um. Although applying a thinner packaging substrate is advantageous in that electrical signal transmission can be made more efficient, but the packaging substrate also should serve as a supporting body of packaging, so it is preferable to apply the glass substrate 21 having the above thickness. Here, the thickness of the glass substrate may be the thickness of the glass substrate itself except for the thickness of the electrically conductive layer on the glass substrate.

The core via 23 may be formed by removing a predetermined region of the glass substrate 21. In particular, the core via 23 may be formed by etching a glass plate physically and/or chemically.

In detail, the core via 23 may be formed by forming a defect (flaw) on the surface of the glass substrate by means of a laser or the like and then applying chemical etching, laser etching, or the like, but the present application is not limited thereto.

The core via 23 comprises a first opening part 233 in contact with the first surface; a second opening part 234 in contact with the second surface; and a minimum inner diameter part 235 having the smallest inner diameter in the entire core via connecting the first opening part 233 and the second opening part 234.

A diameter CV1 of the first opening part may be substantially equal to or different from a diameter CV2 of the second opening part.

The minimum inner diameter part 235 may be deposed in the first opening part 233 or the second opening part 234. In this case, the core via 23 may be a cylindrical type core via or a (truncated) triangular pyramid type core via. In this case, a diameter CV3 of the minimum inner diameter part 235 corresponds to the smaller one between the diameter of the first opening part 233 and the diameter of the second opening part 234.

The minimum inner diameter part 235 may be deposed between the first opening part 233 and the second opening part 234. In this case, the core via 23 may be a barrel type core via. In this case, the diameter CV3 of the minimum inner diameter part 235 may be smaller than the larger one between the diameter of the first opening part 233 and the diameter of the second opening part 234.

The core distribution layer 24 comprises a core distribution pattern 241, which is an electrically conductive layer for electrically connecting the first surface 213 and the second surface 214 of the glass substrate 21 through a through-via (core via); and a core insulating layer 223 surrounding the core distribution pattern 241.

The core layer 22 has an electrically conductive layer formed thereon through a core via and thus serves as an electrical passage passing through the glass substrate 21. Also, the core layer 22 may connect upper and lower parts of the glass substrate 21 with a relatively short distance to have faster electrical signal transfer and lower loss property.

The core distribution pattern 241 comprises patterns that electrically connect the first surface 213 and the second surface 214 of the glass substrate 21 through the core via 23. Specifically, the core distribution pattern 241 comprises a first surface distribution pattern 241a, which is an electrically conductive layer deposed on at least a part of the first surface 213, a second surface distribution pattern 241c, which is an electrically conductive layer deposed on at least a part of the second surface 214, and a core via distribution pattern 241b, which is an electrically conductive layer for electrically connecting the first surface distribution pattern 241a and the second surface distribution pattern 241c to each other through the core via 23. As the electrically conductive layer, for example, a copper plating layer may be applicable, but the present application is not limited thereto.

The glass substrate 21 serves as an intermediate role or an intermediary for connecting the semiconductor element unit 30 and the motherboard 10 to the upper and lower parts thereof, respectively, and the core via 23 serves as a passage for transferring electrical signals thereof, thereby facilitating signal transfer.

The thickness of the electrically conductive layer measured at the larger one between the first opening part and the second opening part by diameter may be equal to or greater than the thickness of the electrically conductive layer formed at the minimum inner diameter part.

The core distribution layer 24 is an electrically conductive layer formed on the glass substrate 21 and may satisfy that a cross cut adhesion test value according to ASTM D3359 is 4B or greater, and specifically may satisfy that the cross cut adhesion test value is 5B or greater. Also, the electrically conductive layer, which is the core distribution layer 24, may have an adhesive strength of 3 N/cm or more and a bonding strength of 4.5 N/cm or more with respect to the glass substrate 21.

When such a degree of bonding strength is satisfied, the bonding strength is sufficient for applying in a packaging substrate and is applied as a bonding strength between the substrate and the electrically conductive layer.

An upper layer 26 is deposed on the first surface 213.

The upper layer 26 may comprise an upper distribution layer 25 and an upper surface contact layer 27 deposed on the upper distribution layer 25, and the uppermost surface of the upper layer 26 may be protected by a cover layer 60 having an opening part capable of being in direct contact with a connecting electrode of the semiconductor element unit deposed thereon.

The upper distribution layer 25 comprises an upper insulating layer 253 deposed on the first surface and an upper distribution pattern 251 that has a predetermined pattern and that is built in the upper insulting layer 253 as an electrically conductive layer having at least a part electrically connected to the core distribution layer 24.

Any insulating layer may be applied as the upper insulating layer 253 as long as the insulating layer is applied to a semiconductor element or a packaging substrate. For example, an epoxy resin containing fillers or the like may be applicable, but the present application is not limited thereto.

The insulating layer may be formed by forming a coating layer and then hardening; or may be formed by laminating an un-hardened or semi-hardened insulating film and then hardening on the core layer. In this case, when pressure sensitive lamination or the like is applied, the insulator is embedded into a space inside the core via, thereby allowing for efficient process progression. Also, when a plurality of insulating layers is stacked, it may be difficult to substantially distinguish between the insulating layers. Therefore, the plurality of insulating layers may be collectively referred to as an upper insulating layer. Also, the core insulating layer 223 and the upper insulating layer 253 may be made of the same insulating material. In this case, the boundary therebetween may not be substantially distinguished. The upper distribution pattern 251 may be an electrically conductive layer deposed in the upper insulating layer 253 in a predetermined form, and may be formed through a build-up layer procedure. In detail, the upper distribution pattern 251 in which an electrically conductive layer is vertically or horizontally formed in a desired pattern may be formed by repeating a process of: forming an insulating layer; removing an unnecessary part of the insulating layer and then forming an electrically conductive layer through copper plating or the like; removing an unnecessary part of the electrically conductive layer and then forming an insulating layer on the electrically conductive layer; and removing an unnecessary part and then forming an electrically conductive layer through plating or the like.

Since the upper distribution pattern 251 is deposed between the core layer 22 and the semiconductor element unit 30, the upper distribution pattern 251 is formed to at least partially have a fine pattern so that the transfer of electric signals to the semiconductor element unit 30 may proceeds smoothly and a desired complicated pattern may be sufficiently accommodated. In this case, the fine pattern may have a width and spacing of less than 4 um, 3.5 um or less, 3 um or less, 2.5 um or less, or 1 um to 2.3 um (hereinafter the description of the fine pattern is the same).

In order to form the upper distribution pattern 251 to comprise a fine pattern, at least two methods are applied in the present application.

One method is to apply a glass substrate 21 as the glass substrate of the packaging substrate. The glass substrate 21 could have a considerably flat surface property with a surface roughness (Ra) being 10 angstroms or less, thereby the influence of surface morphology of a supporting substrate on formation of the fine pattern can minimize.

The other method is based on the property of the insulating layer. As the insulating layer, a filler component may be applicable in addition to resin, and inorganic particles such as silica particles may be applicable as the filler. When the inorganic particles are applied to the insulating layer as the filler, the size of the inorganic particles can affect whether to form the fine pattern. Therefore, particle fillers with an average diameter of 150 nm or less are applied as the insulating layer in the present application. In particular, particle fillers with an average diameter of 1 nm to 100 nm are comprised in insulating layer. Such a characteristic can minimize the influence of the insulating layer itself on the formation of an electrically conductive layer with a width of several micrometers or below while maintaining necessary properties of the insulating layer at a certain level or more, and can also help form a fine pattern with good adhesion onto the surface, due to the fine surface morphology.

The upper surface contact layer 27 comprises an upper surface connection pattern 272 and an upper surface connecting electrode 271. The upper surface connection pattern 272 is deposed in the upper insulating layer 253 and partially electrically connected to the upper distribution pattern 251. The upper surface connecting electrode 271 is configured to electrically connect the semiconductor element unit 30 and the upper surface connection pattern 272. The upper surface connection pattern 272 may be deposed on one surface of the upper insulating layer 253 or may be embedded with at least a part thereof being exposed on the upper insulating layer 253. For example, the upper insulating layer 253 may be formed through plating or the like when the upper surface connection pattern 272 is deposed on one side of the upper insulating layer 253. Also, the upper insulating layer 253 may be formed by forming a copper plating layer or the like and then partially removing the insulating layer or the electrically conductive layer through surface polishing or surface etching when the upper surface connection pattern 272 is embedded with at least a part thereof being exposed to the upper insulating layer 253.

The upper surface connection pattern 272 may at least partially comprise a fine pattern like the above-described upper distribution pattern 251. The upper surface connection pattern 272 comprising the fine pattern may enable a plurality of elements to be electrically connected to one another even in a narrow area, facilitate electrical signal connection between elements or with the outside, and this allows to achieve more integrated packaging.

The upper surface connecting electrode 271 may be connected to the semiconductor element unit 30 directly through a terminal or via a element connection unit 51 such as a solder ball.

The packaging substrate 20 is also connected to the motherboard 10. The motherboard 10 may be directly connected to the second surface distribution pattern 241c, which is a core distribution layer deposed on at least a part of the second surface 214 of the core layer 22, through a motherboard terminal or may be electrically connected to the second surface distribution pattern 241c via a board connection unit such as a solder ball. Also, the second surface distribution pattern 241c may be connected to the motherboard 10 through the lower layer 29 deposed under the core layer 22.

The lower layer 29 comprises a lower distribution layer 291 and a lower surface connection layer 292.

The lower distribution layer 291 comprises i) a lower insulating layer 291b in partial contact with the second surface 214; and ii) a lower distribution pattern 291a at least partially electrically connected to the core distribution layer, the lower distribution pattern 291a being embedded in the lower insulating layer 291b and having a predetermined pattern.

The lower surface connection layer 292 comprises i) a lower surface connecting electrode 292a electrically connected to the lower surface connection pattern and may further comprise ii) a lower surface connection pattern 292b at least partially electrically connected to the lower distribution pattern 291a and at least partially exposed to one surface of the lower insulating layer 291b.

The lower surface connection pattern 292b, which is a part connected to the motherboard 10, may be formed as a non-fine pattern wider than the fine pattern, unlike the upper surface connection pattern 272, in order to efficiently transfer electric al signals.

One feature of the present application is that substantially an additional substrate other than the glass substrate 21 is not applied to the packaging substrate 20 deposed between the semiconductor element unit 30 and the motherboard 10.

Conventionally, an interser and an organic substrate were stacked between the element and the motherboard. It is considered that such a multi-stage form have been applied in at least two reasons. One reason is that there is a scale problem in directly bonding the fine pattern of the element to the motherboard, and the other reason is that wiring damage may occur due to a difference in thermal expansion coefficient during the bonding process or during the driving process of the semiconductor element. The present application have solved the problems by applying the glass substrate with a thermal expansion coefficient similar to that of the semiconductor element and by forming, on the first surface of the glass substrate and an upper layer thereof, a fine pattern with a fine scale enough to mount the elements.

It is possible to make the overall thickness of the semiconductor device 100 thinner by the semiconductor device 100 having a considerably thin packaging substrate 20, and it is also possible to position a desired electrical connection pattern even in a small area by applying the fine pattern. In detail, the packaging substrate 20 may have a thickness of 2000 um or less, 1500 um or less, or 900 um. Also, the packaging substrate 20 may have a thickness of 120 um or more or 150 um or more. Due to the above-described characteristics, the packaging substrate can electrically and structurally connect the element and the motherboard stably even with a relatively thin thickness, thereby contributing to miniaturization of the semiconductor device in aspect of surface area and thickness.

Figure 6:
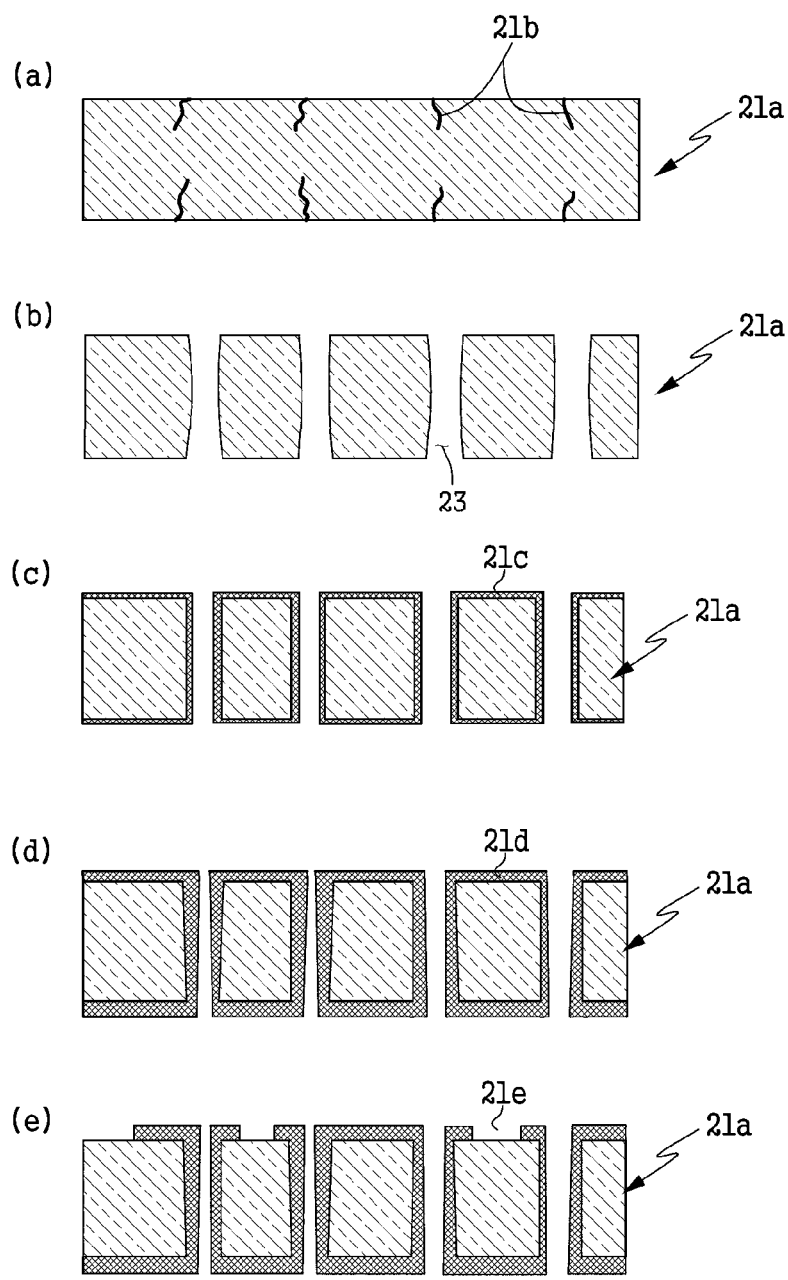
FIGS. 6 to 8 are flowcharts for illustrating a process of manufacturing a packaging substrate by using cross sections thereof according to an embodiment of the present application.
Figure 7:
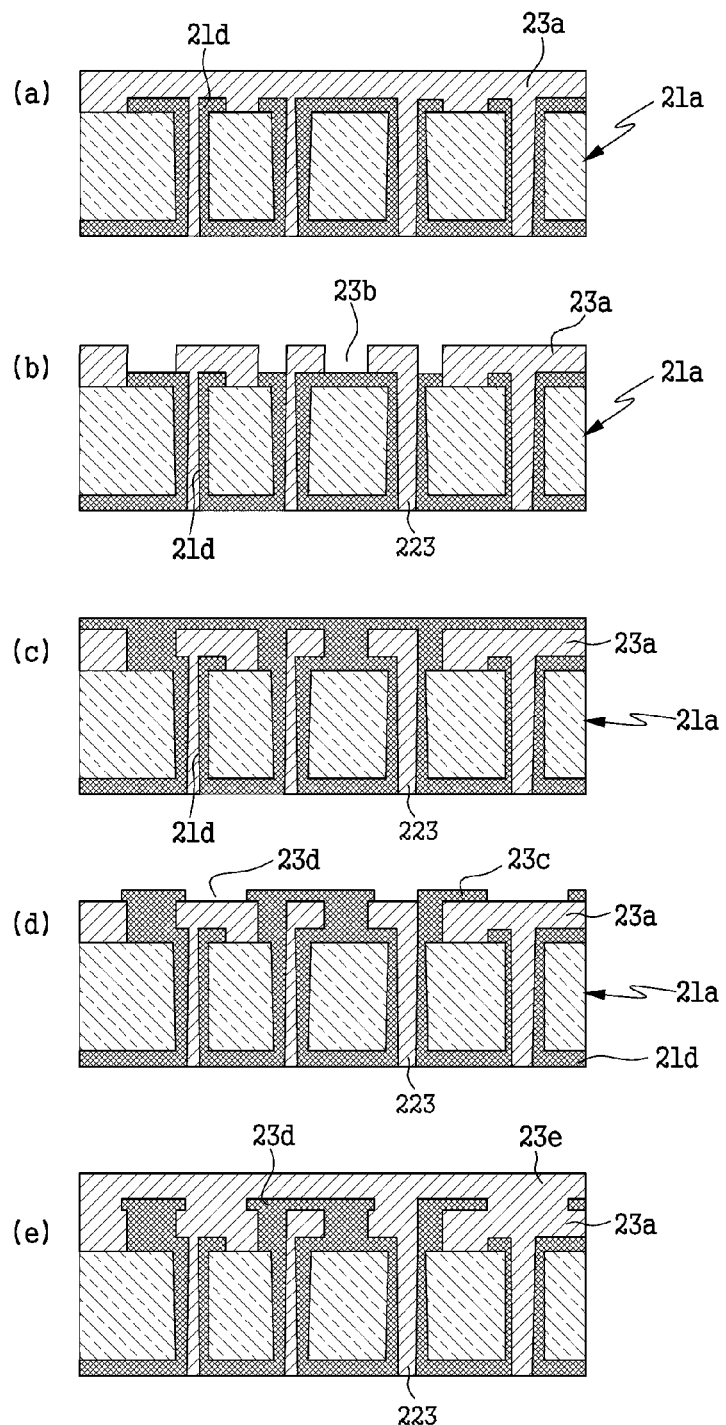
Figure 8:
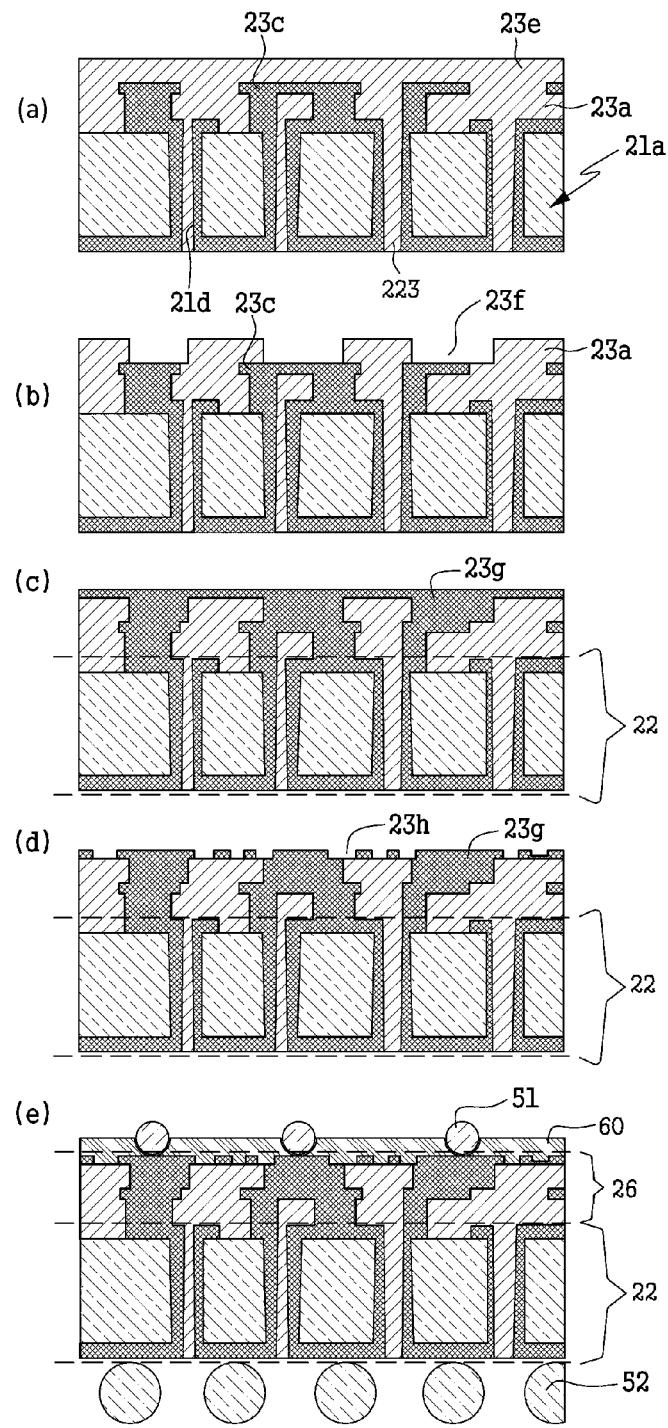

FIGS. 6 to 8 are flowcharts for illustrating a process of manufacturing a packaging substrate by cross sections thereof according to an embodiment of the present application. A method of manufacturing the packaging substrate according to another embodiment of the present application will be described below with reference to FIGS. 6 to 8.

The method of manufacturing the packaging substrate of the present application comprises a preparation step in which a defect is formed at predetermined positions of a first surface and a second surface of a glass substrate; an etching step in which an etchant is applied to the glass substrate where the detect is formed to provide a glass substrate with a core via formed thereon; a core layer forming step in which the surface of the glass substrate with the core via formed thereon is plated to form a core distribution layer, which is an electrically conductive layer, and thus form a core layer; and an upper layer forming step in which an upper distribution layer, which is an electrically conductive layer surrounded by an insulting layer, is formed on one side of the core layer.

The core layer forming step may comprise a pre-treatment process in which an organic/inorganic composite primer layer comprising nanoparticles having amine groups is formed on the surface of the glass substrate having the core via formed thereon to prepare a pre-processed glass substrate; and a plating process in which a metal layer is plated on the pre-processed glass substrate.

The core layer forming step may comprise a pre-treatment process in which a metal-containing primer layer is formed on the surface of the glass substrate having the core via formed thereon through sputtering to prepare a pre-processed glass substrate; and a plating process in which a metal layer is plated on the pre-processed glass substrate.

An insulating layer forming step may be further comprised between the core layer forming step and the upper layer forming step.

The insulating layer forming step may be a step of positioning an insulating film on the core layer and performing pressure sensitive lamination to form a core insulating layer.

The method of manufacturing the packaging substrate will be described in more detail.

1) Preparation Step (Glass Defect Forming Process): A glass substrate 21a having flat first and second surfaces is prepared, and a defect (hole) 21b is formed at a predetermined position on the surface of the glass substrate in order to preparing a core via forming step. As the glass substrate, a glass substrate applied to a substrate of an electronic device or the like may be applicable. For example, a non-alkali glass substrate may be applicable, but the present application is not limited thereto. As commercially available products, products manufactured by manufacturer such as Corning Inc., Schott AG, and AGC Inc. may be applicable. In order to form the defect (hole), mechanical etching, laser irradiation, or the like may be applicable.

2) Etching Step (Core Via Forming Step): The glass substrate 21a having the defect (hole) 21b with thereon forms a core via 23 through a physical or chemical etching process. During the etching process, the glass substrate 21a may form a core via (though via) at the defective part and also the surface of the glass substrate 21a may be etched at the same time. A masking film may be applicable in order to prevent the surface of the glass substrate from being etched, but the glass substrate itself with the defect may be etched in consideration of any inconvenience caused by a process of applying and removing the masking film. In this case, the glass substrate having the core via may be somewhat thinner than the initial glass substrate.

3-1) Core Layer Forming Step: An electrically conductive layer, for example, metal layer 21d, is formed on the glass substrate. The metal layer may contain copper metal, but the present application is not limited thereto.

The surface of glass (comprising the surface of the glass substrate and the surface of the core via) and the surface of copper metal have different characteristics and thus are less adhesive. In the present application, the adhesion between the glass surface and the metal is improved by two methods, i.e., a dry method and a wet method.

The dry method is a method applying sputtering, that is, a method of forming a seed layer 21c inside the core via and on the glass surface through metal sputtering. During the formation of the seed layer, another metal such as titanium, chromium, and nickel may be sputtered together with copper or the like. In this case, it is considered that glass-metal adhesion is improved by the anchor effect in which the surface morphology of the glass and the metal particles interact with each other.

The wet method is a method applying primer treatment, that is, a method of forming a primer layer 21c by performing pre-treatment with a compound having a functional group such as amine Depending on a desired degree of adhesion, after pre-treatment with a silane coupling agent, the primer treatment may be performed with a compound or particle having an amine functional group. As described above, it is necessary for the supporting substrate of the present application to have a high performance enough to form a fine pattern, and the high performance should be maintained even after the primer treatment. Accordingly, when such a primer contains nanoparticles, it is preferable that nanoparticles having an average diameter of 150 nm or less are applied. For example, it is preferable that nanoparticles are applied as particles having amine groups. The primer layer may be formed by applying, for example, a bonding-improving agent manufactured in CZ series by MEC Inc.

In the seed layer/primer layer 21c, an electrically conductive layer, i.e., a metal layer may be selectively formed with or without removing a part where the formation of the electrically conductive layer is unnecessary. Also, in the seed layer/primer layer 21c, a subsequent process may be performed after a part where the formation of the electrically conductive layer is necessary or a part where the formation of the electrically conductive layer is unnecessary is selectively processed such that the part becomes activated or deactivated for metal plating. For example, light irradiation treatment such as laser light of a certain wavelength, chemical treatment, or the like may be applied for the processing for activation or deactivation. A copper plating method or the like applied for manufacturing a semiconductor element may be applied to form the metal layer, but the present application is not limited thereto.

During the metal plating, the thickness of the electrically conductive layer may be regulated by regulating several variables such as the concentration of a plating solution, a plating time, and the type of an additive applied.

When a part of the core distribution layer is unnecessary, the part may be removed. An etching layer 21e of the core distribution layer may be formed by forming an electrically conductive layer in a predetermined pattern by performing metal plating after partially removing or deactivating the seed layer.

3-2) Insulating Layer Forming Step: An insulating layer forming step may be performed in which an empty space of a core via is filled with an insulating layer after the core distribution layer, which is the electrically conductive layer, is formed. In this case, the insulating layer as a film type may be applied. For example, the film-type insulating layer may be applied through pressure sensitive lamination or the like. When the pressure sensitive lamination is performed, the insulating layer may be sufficiently embedded into the empty space inside the core via to form a core insulating layer with reducing possibility of forming void defect.

4) Upper Layer Forming Step: An upper distribution layer comprising an upper insulating layer and an upper distribution pattern is formed on the core layer. The upper insulating layer may be formed by coating a resin composition forming an insulating layer 23a or stacking an insulating film. Simply, the stacking of the insulting film is preferable. The stacking of the insulating film may be performed by laminating and hardening the insulating film. In this case, when pressure sensitive lamination is applied, an insulating resin may be sufficiently embedded even into an empty part where the electrically conductive layer is not formed inside the core via. The upper insulating layer is at least partially in direct contact with the glass substrate, and thus provides sufficient adhesion. In detail, the glass substrate and the upper insulating layer may have an adhesion test value of 4 dB or more as according to ASTM D3359.

The upper distribution pattern may be formed by repeating a process of forming the insulating layer 23a, forming a patterned conductive layer 23c in a predetermined pattern, and etching an unnecessary part to form an etching layer 23d of the electrically conductive layer. An electrically conductive layer formed adjacent to each other with the insulating layer interposed therebetween may be formed by forming a blind via 23b on the insulating layer and then performing a plating process. A dry etching method such as laser etching and plasma etching, and the like, a wet etching method using a masking layer and an etching solution, and the like may be applied to form the blind via.

5) Upper Surface Connection Layer and Cover Layer Forming Step: An upper surface connection pattern and an upper surface connecting electrode may be formed similarly to the formation of the upper distribution layer. In detail, the upper surface connection pattern and the upper surface connecting electrode may be formed by forming an etching layer 23f of an insulating layer 23e on the insulating layer 23e, forming an electrically conductive layer, for example, layer 23g, and then forming an etching layer 23h of the electrically conductive layer. However, a method of selectively forming only the electrically conductive layer may be applied without the etching. A cover layer may be formed to have an opening part (not shown) at a position corresponding to the upper surface connecting electrode such that the upper surface connecting electrode is exposed and directly connected to an element connection unit, a terminal of an element, or the like.

6) Lower Surface Connection Layer and Cover Layer Forming Step: A lower distribution layer and/or a lower surface connection layer, and optionally a cover layer (not shown) may be formed similarly to the above-described formation of the upper surface connection layer and the cover layer.

Although the exemplary embodiments have been described in detail, the scope of the present invention is not limited thereto, and modifications and alterations made by those skilled in the art using the basic concept of the present invention defined in the following claims fall within the scope of the present invention.

What is claimed is:

1. A semiconductor device comprising:
an element unit comprising a semiconductor element; and
a packaging substrate, electrically connected to the element unit,
wherein the packaging substrate comprises:
a core layer comprising a glass substrate having a first surface opposing a second surface, a plurality of core vias, each having a varying diameter, passing through the glass substrate in a thickness direction thereof, and a core distribution layer comprising a core conductive layer disposed on a surface of core vias electrically connecting through the core vias between a conductive layer of the first surface and a conductive layer of the second surface; and
an upper layer, disposed on the first surface, and comprising an upper conductive layer configured to externally connect the core distribution layer.

2. The semiconductor device of claim 1, wherein an organic substrate is substantially excluded from the packaging substrate.

3. The semiconductor device of claim 1, further comprising a board unit placed under the packaging substrate,
wherein any substrate other than the glass substrate is not applied between the element unit and the board unit.

4. The semiconductor device of claim 1, wherein a surface conductive layer is disposed on a surface of the glass substrate and has an adhesive strength of 3N/cm or more with respect to the glass substrate.

5. The semiconductor device of claim 1, wherein a diameter of an upper end and a diameter of a lower end of each of the plurality of vias are substantially equal.

6. The semiconductor device of claim 1, wherein a diameter of an upper end and a diameter of a lower end of each of the plurality of vias are different.

7. The semiconductor device of claim 1, wherein a diameter of an intermediate portion and a diameter of a lower end of each of the plurality of vias are different.

8. The semiconductor device of claim 7, wherein the diameter of the intermediate portion and a diameter of an upper end of each of the plurality of vias are different.

9. The semiconductor device of claim 1, wherein the core conductive layer disposed on the surface of core vias has a through hole formed therethrough.

10. A packaging substrate comprising:
a core layer comprising a glass substrate having a first surface opposing a second surface, a plurality of core vias, each having a varying diameter, passing through the glass substrate in a thickness direction thereof, and a core distribution layer comprising a core conductive layer disposed on a surface of surface of the core via electrically connecting through the core vias between a conductive layer of the first surface and a conductive layer of the second surface; and an upper layer disposed on the first surface, and comprising an upper conductive layer configured to externally connect the core distribution layer, wherein an organic substrate is substantially excluded from the packaging substrate.

11. The packaging substrate of claim 10, wherein a surface conductive layer is disposed on a surface of the glass substrate and has an adhesive strength of 3N/cm or more with respect to the glass substrate.

12. The packaging substrate of claim 10, wherein a diameter of an upper end and a diameter of a lower end of each of the plurality of vias are substantially equal.

13. The packaging substrate of claim 10, wherein a diameter of an upper end and a diameter of a lower end of each of the plurality of vias are different.

14. The packaging substrate of claim 10, wherein a diameter of an intermediate portion and a diameter of a lower end of each of the plurality of vias are different.

15. The packaging substrate of claim 14, wherein the diameter of the intermediate portion and a diameter of an upper end of each of the plurality of vias are different.

16. The packaging substrate of claim 10, wherein the core conductive layer disposed on the surface of core vias has a through hole formed therethrough.

* * * * *